US012676189B2

(12) United States Patent　　　　(10) Patent No.:　US 12,676,189 B2
Lee　　　　　　　　　　　　　　　　　(45) Date of Patent:　Jul. 7, 2026

(54) STACK-TYPE MEMORY DEVICE HAVING A LEAKAGE CONTROL BLOCK VERTICALLY BETWEEN A MEMORY CELL ARRAY AND A PERIPHERAL CIRCUIT BLOCK

(71) Applicant: SK hynix Inc., Gyeonggi-do (KR)

(72) Inventor: Byung Ho Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 406 days.

(21) Appl. No.: 18/521,512

(22) Filed: Nov. 28, 2023

(65) Prior Publication Data

US 2025/0029658 A1　　Jan. 23, 2025

(30) Foreign Application Priority Data

Jul. 19, 2023　　(KR) ........................ 10-2023-0093772

(51) Int. Cl.
　　*H10B 12/00*　　　(2023.01)
　　*G11C 16/04*　　　(2006.01)
　　*H10B 41/10*　　　(2023.01)
　　*H10B 41/27*　　　(2023.01)
　　*H10B 41/40*　　　(2023.01)
　　*H10B 43/10*　　　(2023.01)
　　　　　(Continued)

(52) U.S. Cl.
　　CPC ......... *G11C 16/0483* (2013.01); *H10B 12/01* (2023.02); *H10B 12/02* (2023.02); *H10B 12/30* (2023.02); *H10B 12/50* (2023.02); *H10B 41/10* (2023.02); *H10B 41/27* (2023.02); *H10B 41/40* (2023.02); *H10B 43/10* (2023.02); *H10B 43/27* (2023.02); *H10B 43/40* (2023.02)

(58) Field of Classification Search
　　CPC .... H10B 12/01–056; H10B 12/30–488; H10B 41/40; H10B 41/41; H10B 41/50; H10B 43/40; H10B 43/50; H10B 12/50; G11C 7/112; G11C 16/24; H10D 88/00; H10D 88/01; H10D 84/856
　　See application file for complete search history.

(56) References Cited

U.S. PATENT DOCUMENTS

RE47,506 E　　　7/2019　Park
2021/0012828 A1*　1/2021　Kim .................... G11C 11/4085
　　　　　　　(Continued)

FOREIGN PATENT DOCUMENTS

KR　　10-2021-0007739 A　　1/2021
KR　　10-2022-0129620 A　　9/2022

*Primary Examiner* — Younes Boulghassoul
(74) *Attorney, Agent, or Firm* — IP & T GROUP LLP

(57) ABSTRACT

A stack-type memory device may include a memory cell array, a peripheral circuit block and a leakage control block. The memory cell array may include at least one memory cell string. The memory cell string may include a plurality of memory cells vertically stacked. The peripheral circuit block may include circuits configured to control operations of the memory cells. The leakage control block may be arranged between the memory cell array and the peripheral circuit block. The leakage control block may include at least one selection switch. The selection switch may selectively connect the memory cell string with the peripheral circuit block and disconnect the memory cell string from the peripheral circuit block. The memory cell array, the leakage control block and the peripheral circuit block may be stacked in the vertical direction.

20 Claims, 16 Drawing Sheets

(51) Int. Cl.
    *H10B 43/27*      (2023.01)
    *H10B 43/40*      (2023.01)

(56)          References Cited

U.S. PATENT DOCUMENTS

| | | | |
|---|---|---|---|
| 2022/0005809 A1* | 1/2022 | Kim | H10D 62/121 |
| 2022/0122974 A1* | 4/2022 | Ryu | H10B 12/30 |
| 2023/0255015 A1* | 8/2023 | Shin | H10B 12/05 |
| | | | 257/296 |
| 2023/0413517 A1* | 12/2023 | Kim | H10W 20/072 |
| 2024/0049482 A1* | 2/2024 | Kim | H10B 12/50 |
| 2024/0292633 A1* | 8/2024 | Kim | H10B 80/00 |

* cited by examiner

FIG. 7

STACK-TYPE MEMORY DEVICE HAVING A LEAKAGE CONTROL BLOCK VERTICALLY BETWEEN A MEMORY CELL ARRAY AND A PERIPHERAL CIRCUIT BLOCK

CROSS-REFERENCES TO RELATED APPLICATION

The present application claims priority under 35 U.S.C. § 119(a) to Korean application number 10-2023-0093772, filed on Jul. 19, 2023, which is incorporated herein by reference in its entirety.

BACKGROUND

1. Technical Field

Various embodiments of the present disclosure generally relate to a stack-type memory device and a method of manufacturing the same, more particularly, to a stack-type memory device configured to reduce a leakage and a method of manufacturing the stack-type memory device.

2. Related Art

In order to satisfy good performance and a low price required by customers, further increases are needed in the integration degree (also referred to as integration density) of semiconductor devices.

The integration degree of semiconductor devices may be an important factor for determining the prices of a product. The integration degree of a two-dimensional or a planar semiconductor device is primarily determined by the footprint area of a unit memory cell. Further, the footprint area of the unit memory cell is dependent upon the available technologies for forming a fine pattern.

Particularly, the fine pattern may be formed using an expensive exposure apparatus or a high resolution of the exposure apparatus. Thus, there may exist a limit for increasing the integration degree of the two-dimensional semiconductor device.

Therefore, a technology for arranging memory cells in a three-dimensional structure and for stacking a memory cell array and a peripheral circuit block in a three-dimensional structure have been developed.

However, because the unit memory cells are vertically stacked, the stack-type semiconductor devices may have an issue with increased charge leakage which may affect the control of the stacked memory cells. These and other issues associated with the stack-type semiconductor devices require new, more effective solutions for reducing charge leakage and effective control of the stacked memory cells.

SUMMARY

According to various embodiments of the present invention, there is provided a stack-type memory device. The stack-type memory device may include a memory cell array, a peripheral circuit block and a leakage control block. The memory cell array may include at least one memory cell string. The memory cell string may include a plurality of memory cells vertically stacked. The peripheral circuit block may include circuits configured to control operations of the memory cells. The leakage control block may be arranged between the memory cell array and the peripheral circuit block. The leakage control block may include at least one selection switch. The selection switch may selectively connect the memory cell string with the peripheral circuit block and disconnect the memory cell string from the peripheral circuit block. The memory cell array, the leakage control block and the peripheral circuit block may be stacked in the vertical direction.

In some embodiments, the selection switch may include a single crystalline pillar, a gate, a gate insulation layer, a drain and a source. The single crystalline pillar may be extended in the vertical direction. The gate may be formed on the pillar. The gate insulation layer may be formed between the pillar and the gate. The drain may be formed at the pillar adjacent to the memory cell array. The source may be formed at the pillar adjacent to the peripheral circuit block.

In some embodiments, the peripheral circuit block may include a column decoding block configured to provide a memory cell selected from the memory cells connected to the memory cell string with a driving voltage. The selection switch may be electrically connected with the column decoding block.

In some embodiments, when a memory cell among the memory cells of the memory cell string connected to the selection switch is selected, the selection switch may be turned-on. Thus, the memory cell string may be selectively connected with the peripheral circuit block. When the memory cells of the memory cell string connected to the selection switch are not be selected, the selection switch may be turned-off. Thus, the memory cell string may be electrically disconnected from the peripheral circuit block.

According to various embodiments, there is provided a stack-type memory device which includes a first structure, a second structure and a third structure. The first structure may include a memory cell array. The memory cell array may include a plurality of memory cell strings. Each of the memory cell strings may include a plurality of memory cells. The second structure may be hybrid-bonded to the first structure. The second structure may include a leakage control block. The leakage control block may include a plurality of selection switches connected to at least one of the memory cell strings. The third structure may be hybrid-bonded to the second structure. The third structure may include a peripheral circuit block. The peripheral circuit block may be selectively connected with or disconnected from the memory cell string by driving the selection switch.

In some embodiments, at least one of the first to third structures may include a wafer, a part of a wafer or a die.

According to an embodiment, there is provided a method of manufacturing a stack-type memory device. In the method of manufacturing the stack-type memory device, a first structure, a second structure and a third structure may be provided. The first structure may include a plurality of memory cell strings. The second structure may include a leakage control block. The third structure may include a peripheral circuit block. The second structure may be hybrid-bonded to an upper surface of the first structure. The third structure may then be hybrid-bonded to an upper surface of the second structure.

In some embodiments, providing the second structure may include providing a single crystalline semiconductor layer. A plurality of selection switches may be formed in the single crystalline semiconductor layer to form the leakage control block. Each of the selection switches may use a part of the single crystalline semiconductor layer as a vertical channel.

In some embodiments, forming the selection switch may include etching the single crystalline semiconductor layer to form a trench configured to define a vertical pillar, forming a gate insulation layer on a sidewall facing an outer sidewall of the vertical pillar, filling the trench with a conductive layer to form a gate, forming a drain in the exposed vertical pillar, planarizing a backside of the single crystalline semiconductor layer to expose the gate and a backside of the vertical pillar, and forming a source on the exposed backside of the vertical pillar.

BRIEF DESCRIPTION OF THE DRAWINGS

The above and another aspects, features, and advantages of the subject matter of the present disclosure will be more clearly understood from the following detailed description taken in conjunction with the accompanying drawings, in which:

FIG. 7 is an enlarged simplified cross-sectional view schematic illustrating a stack-type memory device in accordance with an embodiments of the present disclosure;

DETAILED DESCRIPTION

Figure 1:
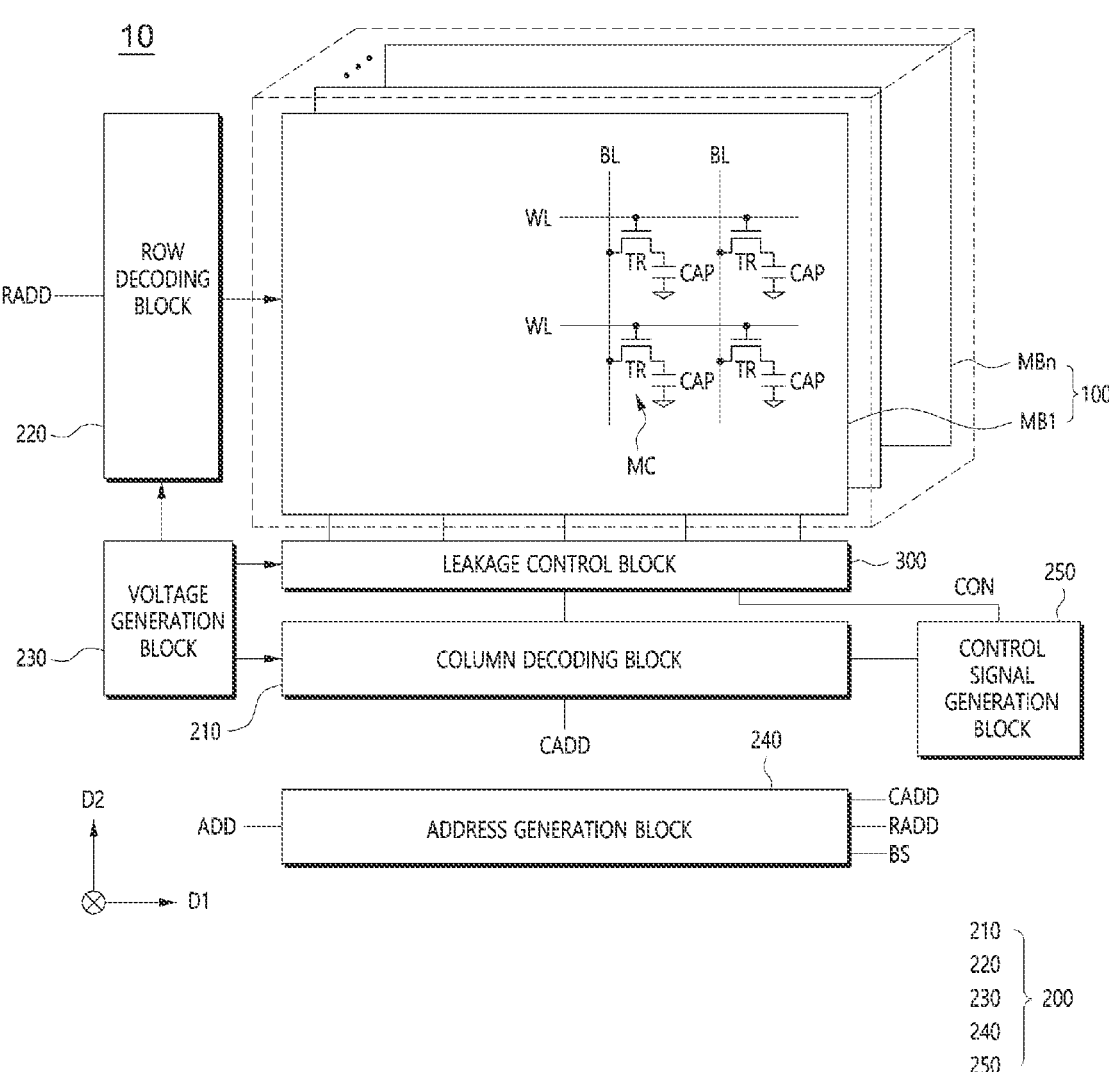
FIG. 1 is a simplified block diagram illustrating a stack-type memory device in accordance with an embodiment of the present disclosure.

Various embodiments of the present disclosure will be described in greater detail with reference to the accompanying drawings. The drawings are schematic illustrations of various embodiments and intermediate structures. As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the technical concepts and scope of the present disclosure.

Embodiments of the present disclosure are described herein with reference to cross-section and/or plan schematics illustrating some embodiments of the present invention. Importantly, the described embodiments are presented as examples of the present invention and should not be construed as limiting the inventive concepts. Although only a few embodiments of the present invention are shown and described, it should be appreciated by those of ordinary skill in the art that various changes and modifications may be made in these embodiments and also other embodiments may be implemented without departing from the principles and technical concepts of the present disclosure.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional volatile memory; conventional non-volatile memory), but also includes an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent to one another, such that no other feature intervenes between the "neighboring" features; or the "neighboring" features may be positioned indirectly adjacent to one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout.

An embodiment of the present disclosure includes a stack-type memory device which may include a leakage control block interposed between a memory cell array and a peripheral circuit block. The leakage control block may include at least one selection switch connected to at least one cell string. The selection switch may include a vertical transistor having a vertical channel. The vertical channel may have a single crystalline structure. The selection switch of the leakage control block may selectively connect or disconnect the memory cell array with or from the peripheral circuit block to prevent movement of a leakage. Hereinafter, the stack-type memory device may be illustrated in detail.

FIG. 1 is a simplified block diagram illustrating a stack-type memory device in accordance with an embodiment of the present disclosure.

Referring to FIG. 1, a stack-type memory device 10 may include a memory cell array 100, a peripheral circuit block 200 and a leakage control block 300.

The memory cell array 100 may include at least one memory bank. For example, the memory cell array 100 may include a plurality of stacked memory banks MB1~MBn. Each of the memory banks MB1~MBn may include a plurality of word lines WL, a plurality of bit lines BL and a plurality of memory cells MC arranged near at the intersection points between the word lines WL and the bit lines BL. In some embodiments, the memory banks MB1~MBn may be integrated in one wafer or a plurality of wafers. For example, each of the memory cells MC may include an access transistor TR and a capacitor CAP.

For example, when the access transistor TR at an intersected point between a selected word line WL and a selected bit line BL may be enabled, data may be written in or read from the capacitor CAP connected to the enabled access transistor TR.

The word lines WL of the memory cell array 100 may be extended parallel to each other along a first direction D1. The bit lines BL may be extended parallel to each other along a second direction D2 intersected with the first direction D1.

In some embodiments, each of the memory banks MB1~MBn may include a plurality of memory cell strings. The memory cell strings may each include a plurality of the stacked memory cells MC along a third direction D3 which may be substantially perpendicular to the first direction D1 and the second direction D2. The memory cells MC arranged in the same memory cell string may be commonly connected to the bit line BL or a part of the bit line BL extended in the third direction D3.

The peripheral circuit block 200 may include circuits configured to control operations of the memory cells MC in the memory cell array 100. The operations of the memory cells MC may include a selection operation of the word line WL, a selection operation of the bit line BL, an operation for storing data in a selected memory cell or a capacitor of a memory cell, and an operation for reading data in the selected memory cell. Typically, the peripheral circuit block 200 may include a column decoding block 210 and a row decoding block 220.

The column decoding block 210 may select at least one of the bit lines BL of the memory cell array 100 based on a column address CADD.

The row decoding block 220 may select at least one of the word lines WL of the memory cell array 100 based on a row address RADD.

The peripheral circuit block 200 may further include a voltage generation block 230, an address generation block 240 and a control signal generation block 250.

The voltage generation block 230 may receive a power voltage. The voltage generation block 230 may provide the column decoding block 210, the row decoding block 220, the address generation block 240, the control signal generation block 250 and other circuit blocks with voltages.

The address generation block 240 may receive an address command ADD provided from a controller to generate the column address CADD, the row address RADD and a bank selection signal.

The control signal generation block 250 may generate a control signal CON and may transmit the control signal CON to the leakage control block 300.

The leakage control block 300 may be arranged between the memory cell array 100 and the peripheral circuit block 200. The leakage control block 300 may include at least one selection switch. The selection switch may selectively connect or disconnect the at least one memory cell string with or from the peripheral circuit block 200, for example, the at least one memory cell string with or from the column decoding block 210.

Figure 2:
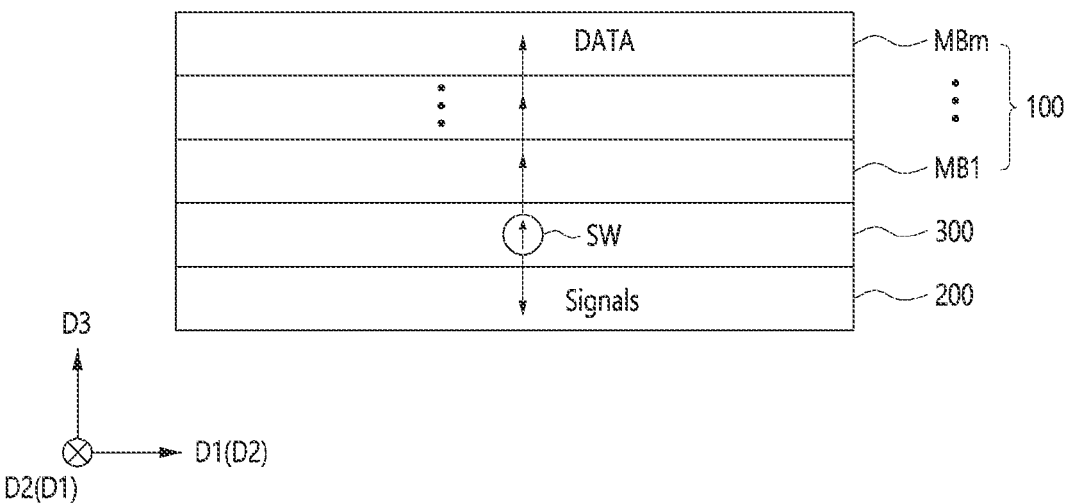
FIGS. 2 and 3 are simplified cross-sectional view schematics illustrating a stack-type memory device in accordance with an embodiment of the present disclosure.
Figure 3:
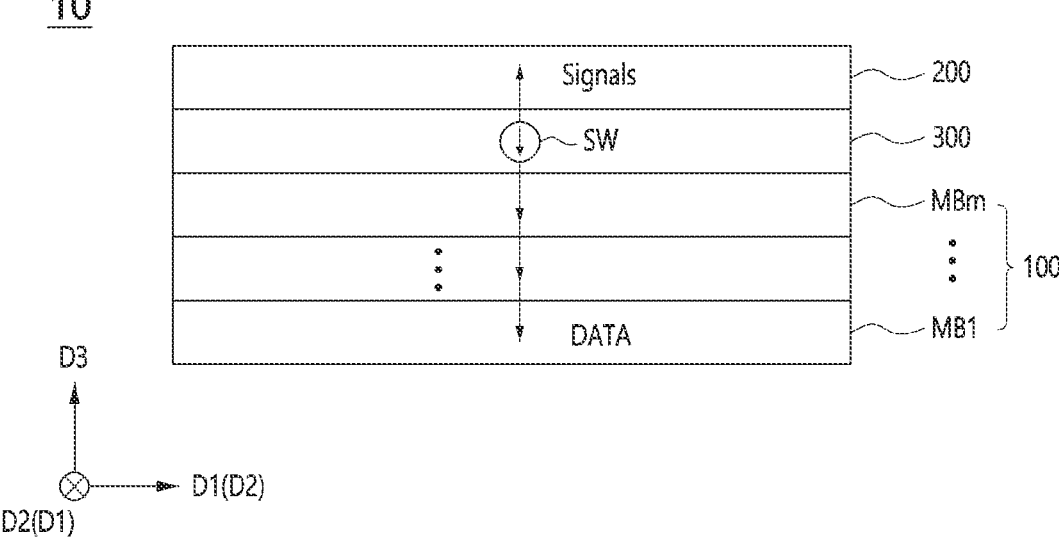

FIGS. 2 and 3 are simplified cross-sectional view schematics illustrating a stack-type memory device in accordance with an embodiment of the present disclosure.

Referring to FIGS. 2 and 3, the peripheral circuit block 200, the leakage control block 300 and the memory cell array 100 in the stack-type memory device 10 may be stacked along the third direction D3.

The memory cell array 100 may include the stacked memory banks MB1~MBn. In some embodiments, the memory banks MB1~MBn may be integrated in one structure. Alternatively, the memory banks MB1~MBn may be integrated in different structures. The different structures may then be coupled or bonded to each other.

The peripheral circuit block 200 may provide a selected memory cell MC of each of the memory banks MB1~MBn with a plurality of driving signals for memory operations. The peripheral circuit block 200 may receive data of the selected memory cell MC in the memory cell array 100.

As mentioned above, the selection switch SW of the leakage control block 300 may form a current transmission path through which the driving signals S and the data DATA may be transmitted between the memory cell array 100 and the peripheral circuit block 200. Further, the selection switch SW may cut off the current transmission path between the memory cell array 100 and the peripheral circuit block 200.

Figure 4:
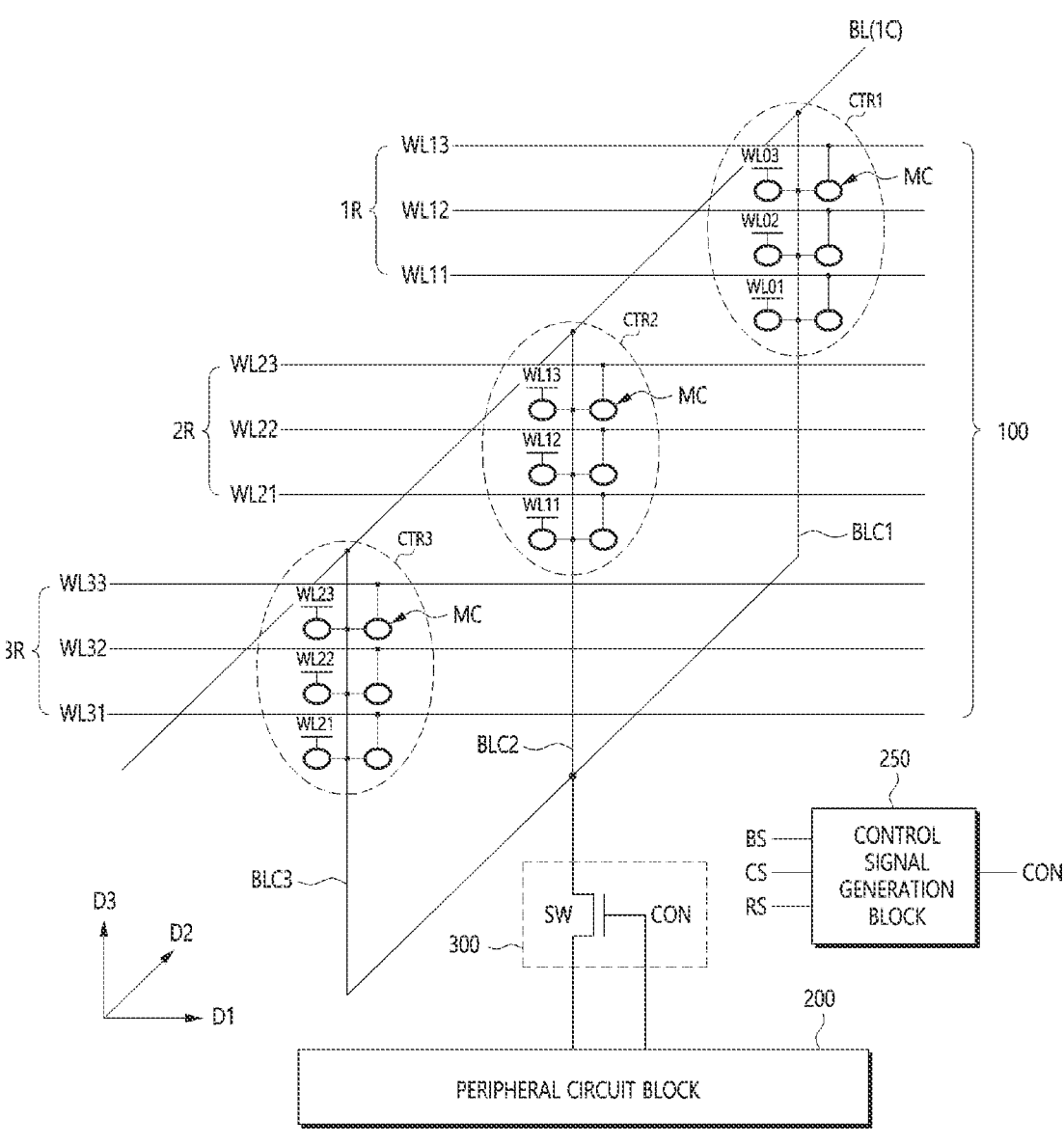
FIGS. 4 to 6 are circuit diagrams illustrating a stack-type memory device in accordance with an embodiment of the present disclosure.
Figure 5:
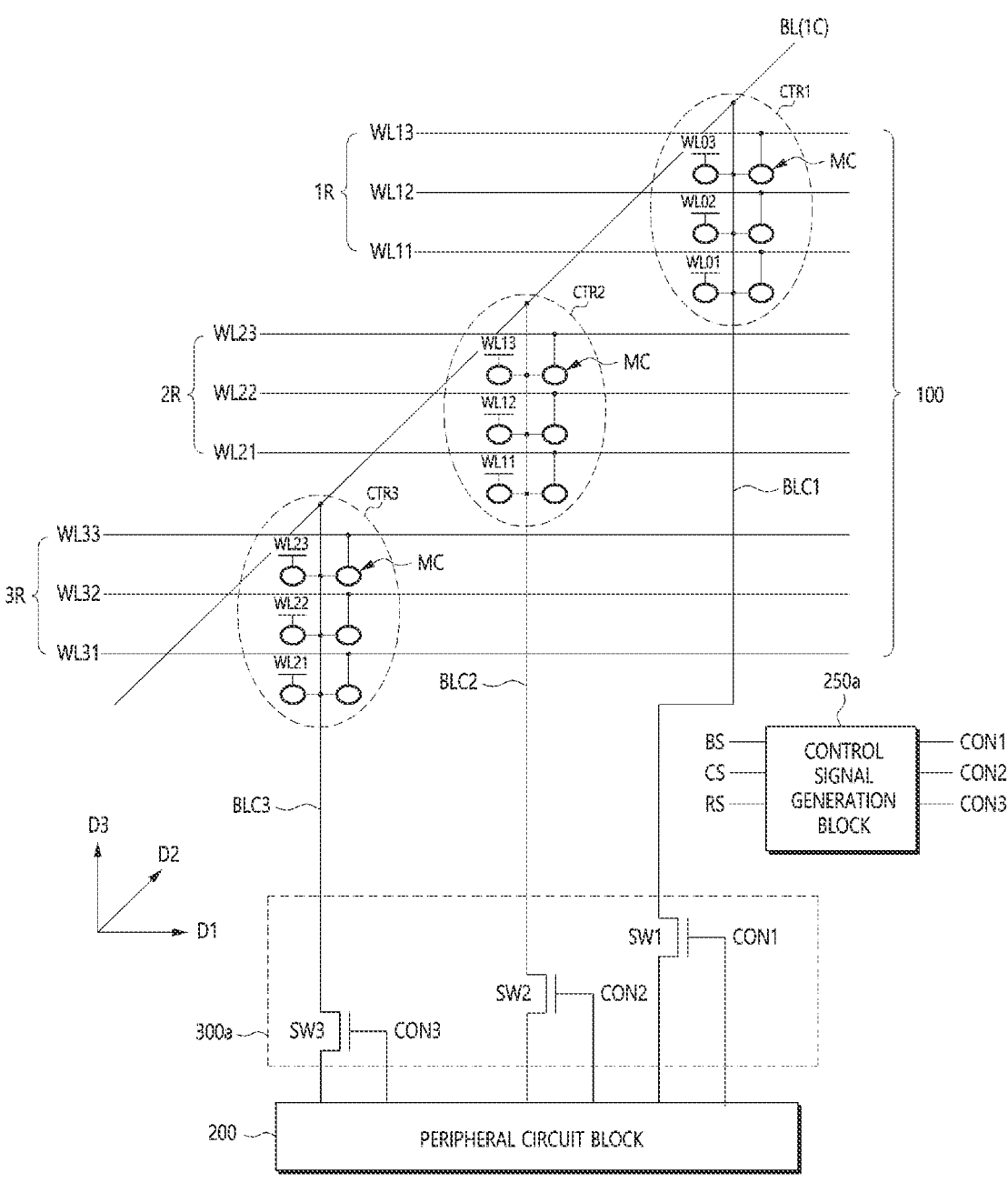
Figure 6:
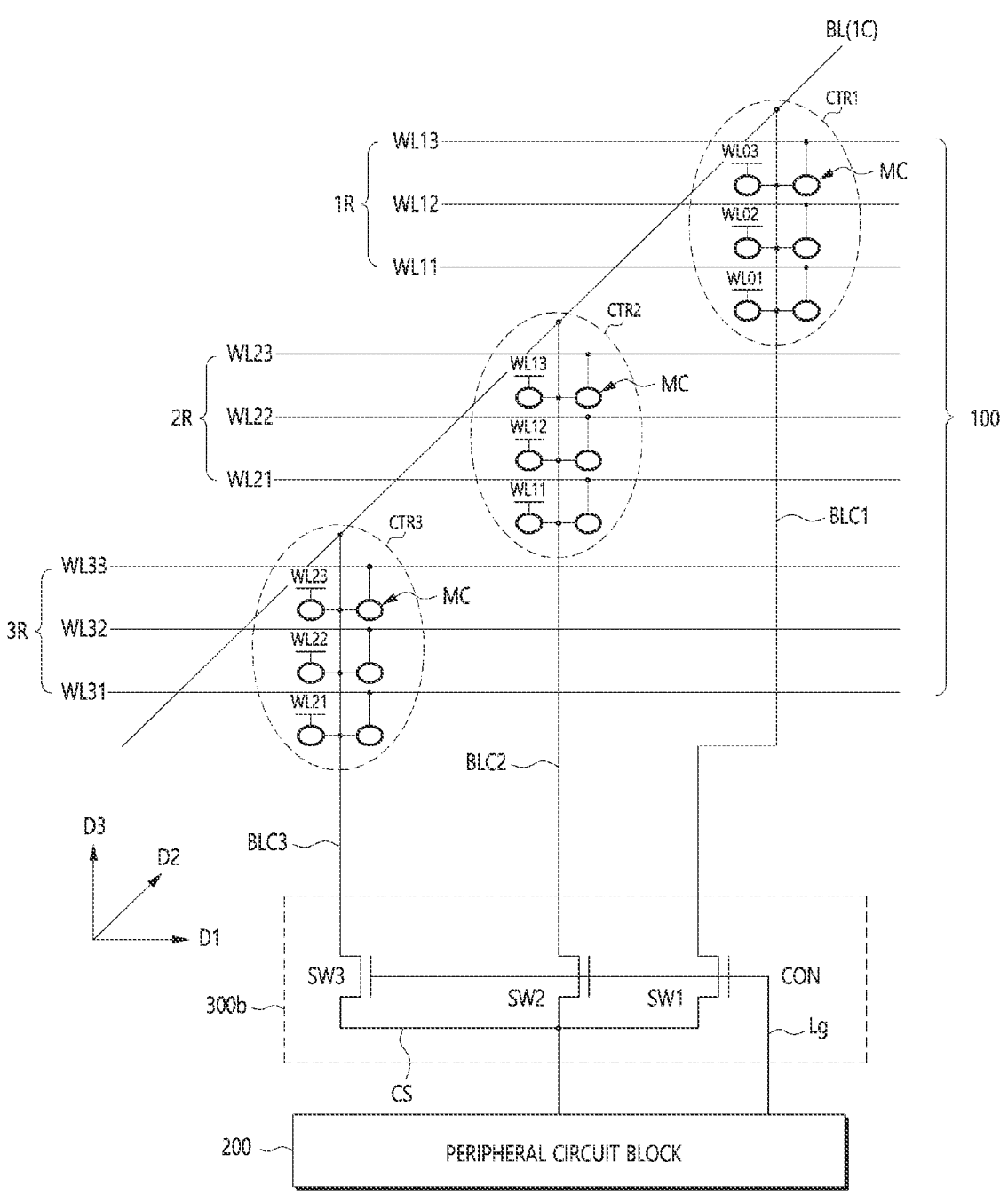

FIGS. 4 to 6 are circuit diagrams illustrating a stack-type memory device in accordance with an embodiment of the present disclosure.

Referring to FIG. 4, a selected memory bank MB of the memory cell array 100 may include a plurality of rows and a plurality of columns. For conveniences of description, three rows 1R~3R and one column 1C may be illustrated in drawings.

The first to third rows 1R, 2R and 3R may each be substantially parallel to the first direction D1. The first column 1C may be substantially parallel to the second direction D2.

Three floors of word lines WL11~WL13, WL21~WL23 and WL31~WL33 may be arranged at the rows 1R, 2R and 3R, respectively. The word lines WL11~WL13 may be electrically isolated from each other. The word lines WL21~WL23 may be electrically isolated from each other. The word lines WL31~WL33 may be electrically isolated from each other.

The bit line BL may be positioned at the first column 1C. The bit line BL may include a plurality of bit line contacts BLC1~BLC3 at intersected points between the word lines WL11~WL13, WL21~WL23 and WL31~WL33. The bit line contacts BLC1~BLC3 may be extended in the third direction D3. Hereinafter, the bit line contacts BLC1~BLC3 may be interpreted as a bit line extended in the third direction D3 or the vertical direction.

The memory cells MC may be positioned at the proximity of intersection points between the bit line contacts BLC1~BLC3 and the word lines WL11~WL13, WL21~WL23 and WL31~WL33.

In some embodiments, a group of the memory cells MC connected to each of the bit line contacts BLC1~BLC may be referred to as memory cell strings CTR1, CTR2 and CTR3.

The leakage control block 300 may include the at least one selection switch SW. For example, the selection switch SW may selectively connect or disconnect the first to third memory cell strings CTR1~CTR3 with or from the peripheral circuit block 200. Particularly, the selection switch SW may include a transistor.

A drain of the selection switch SW may be commonly connected to the bit line contacts BLC1~BLC3 of the first to third memory cell strings CTR1~CTR3. A source of the selection switch SW may be connected to the peripheral circuit block 200, for example, the column decoding block 210. A gate of the selection switch SW may receive the control signal CON. For example, the control signal CON may be generated from the control signal generation circuit 250 of the peripheral circuit block 200. The control signal generation circuit 250 may generate the control signal CON based on address information of a selected memory cell. The address information of the selected memory cell may include a column selection signal CS and a row selection signal RS. For example, when the memory cell array 100 includes the memory banks MB1~MBn in FIG. 1, the address information of the selected memory cell may further include a bank selection signal BS as well as the column selection signal CS and the row selection signal RS. Thus, the control signal generation circuit 250 may generate the control signal CON by a combination of the bank selection signal BS, the column selection signal CS and the row selection signal RS. For example, the address generation block 240 may generate the bank selection signal BS. The column decoding block 210 may generate the column selection signal CS. The row decoding block 220 may generate the row selection signal RS.

Alternatively, the control signal generation circuit 250 may output the enabled control signal CON to the selection switch SW connected to the selected memory cell MC based on the address information. The control signal generation circuit 250 may output the disabled control signal CON to the selection switch SW connected to the non-selected memory cells MC.

For example, when the control signal CON is enabled, the selection switch SW may be turned-on. The peripheral circuit block 200 may provide the bit line contacts BLC1~BLC3 with the driving voltage, i.e., a bit line voltage through the selection switch SW in accordance with an operation command for determining the memory operation. Further, data in the selected memory cell MC may be transmitted to the peripheral circuit block 200 through the bit line contacts BLC1~BLC3 and the selection switch SW in accordance with the operation command. When the operation command is a write command, the bit line voltage may be a write voltage. When the operation command is a read command, the bit line voltage may be a read voltage.

Because the memory cells MC of the memory cell array 100 are densely arranged in the vertical and horizontal directions, a leakage may be generated at the non-selected memory cells MC around the selected memory cell MC due to an influence of the selected memory cell MC on the non-selected memory cells MC. This may be a row hammering deep-seated in a DRAM device. Particularly, in the stack-type memory device, leakage charges generated at the memory cell array 100 may flow into the peripheral circuit block 200 to cause other electrical problems of the peripheral circuit block 200.

In contrast, when the leakage control block 300 with the selection switch SW may be interposed between the memory cell array 100 and the peripheral circuit block 200, the at least one memory cell strings CTR1~CTR3 including the non-selected memory cells MC and the peripheral circuit block 200 may be electrically disconnected from each other by the selection switch SW. Thus, the charges in the non-selected memory cells MC may not flow into the peripheral circuit block 200. The charge in the non-selected memory cells MC may be returned to an original position, i.e., an original memory cell. As a result, data loss may be prevented.

Alternatively, as shown in FIG. 5, a leakage control block 300a may include a plurality of selection switches SW1~SW3 connected to the memory cell strings CTR1~CTR3, respectively. That is, the selection switches SW1~SW3 may be connected to the bit line contacts BLC1~BLC3, respectively, on a one to one correspondence.

The selection switches SW1~SW3 may be driven in response to a plurality of respective control signals CON1~CON3. A control signal generation circuit 250a in the peripheral circuit block 200 may generate the control signals CON1~CON3. The control signal generation circuit 250a may generate the control signals CON1~CON3 by the combination of the bank selection signal BS, the column selection signal CS and the row selection signal RS.

For example, when the memory cell MC connected to the first bit line contact BLC1 of the first memory cell string CTR1 is selected and the memory cells MC of the second and third memory cell strings CTR2 and CTR3 are not selected, the control signal generation circuit 250a may output the enabled first control signal CON1 and the disabled second and third control signals CON2 and CON3.

Therefore, the first selection switch SW1 may be turned-on based on the enabled first control signal CON1 so that the bit line voltage in accordance with the operation command may be transmitted to the first bit line contact BLC1.

The second and third selection switches SW2 and SW3 may be turned-off based on the disabled second and third control signals CON2 and CON3, respectively.

Although leakage charges may be generated at the non-selected memory cells MC of the second and third memory cell strings CTR2 and CTR3 by the selected memory cell MC of the first memory cell string CTR1, the leakage current by the leakage charges may not be transmitted to the peripheral circuit block 200 by the turn-off of the second and third selection switches SW2 and SW3.

Further, as shown in FIG. 6, a leakage control block 300b may include first to third selection switches SW1~SW3 connected between the first to third memory cell strings CTR1~CTR3 and the peripheral circuit 200. Specifically, the first selection switch SW1 is connected between the first memory cell string CTR1 and the peripheral circuit 200, the second selection switch SW2 is connected between the second memory cell string CTR2 and the peripheral circuit 200, and the third selection switch SW3 is connected between the third memory cell string CTR3 and the peripheral circuit 200. Gates of the first to third selection switches SW1~SW3 may commonly receive the control signal CON from the peripheral circuit block 200. The source of each of the first to third selection switches SW1~SW3 may be commonly connected to the peripheral circuit block 200, i.e., through a common line (not shown) in the peripheral circuit block 200. Reference numeral Lg denotes a gate signal line for transmitting the control signals CON from the peripheral circuit block 200 to the gate of each of the first to third selection switches SW1~SW3.

Figure 7:
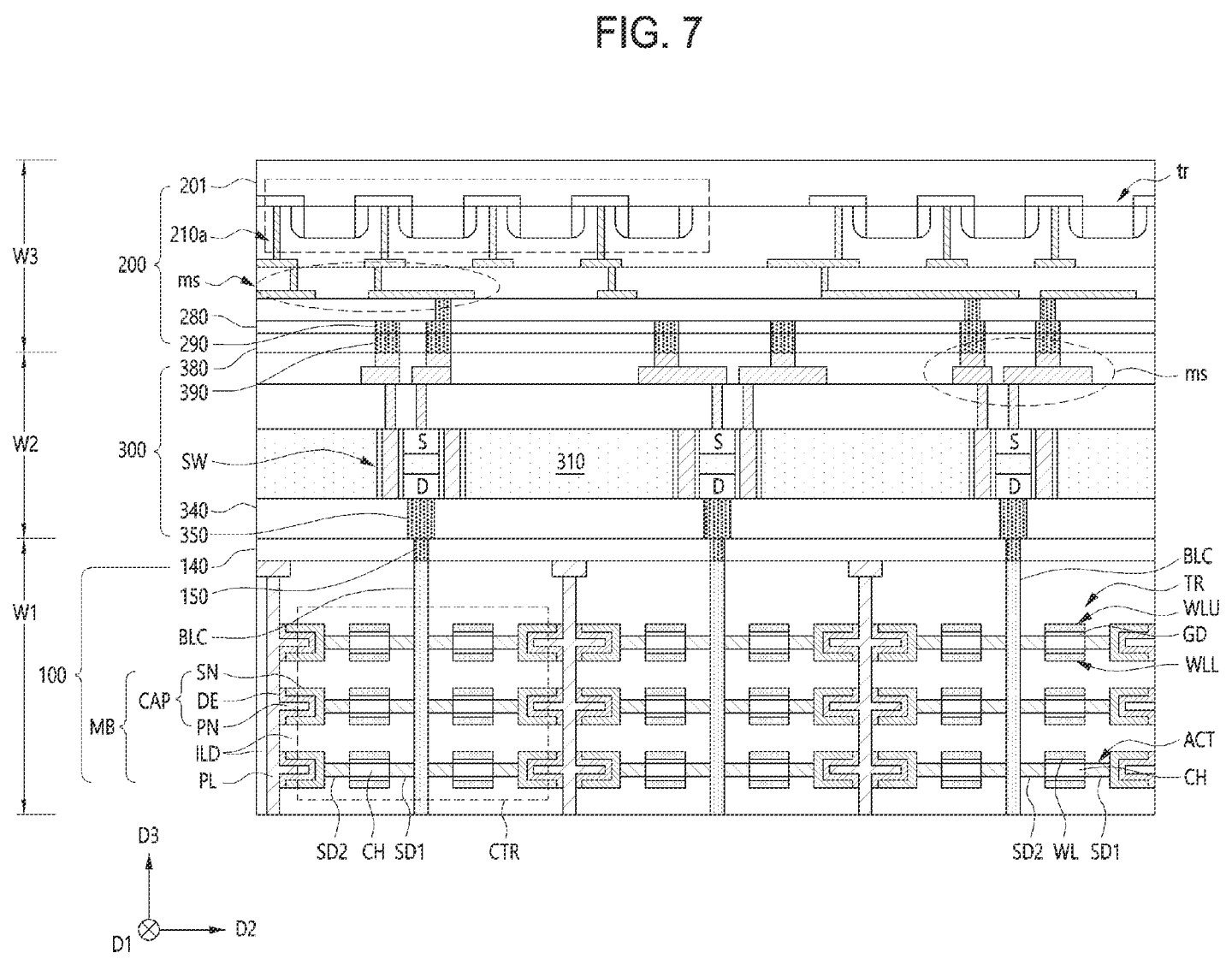

FIG. 7 is an enlarged simplified cross-sectional view schematic illustrating a stack-type memory device in accordance with an embodiment of the present disclosure.

The memory cell array 100, the peripheral circuit block 200 and the leakage control block 300 of the stack-type memory device 10 may be integrated in different structures. The memory cell array 100, the peripheral circuit block 200 and the leakage control block 300 may be integrated in different structures, for example, stacking them over each other with the leakage control block disposed between the peripheral circuit board 200 and the memory cell array 100, and bonding them to each other as shown, for example, in FIG. 2 or FIG. 3.

Referring to FIG. 7, the stack-type memory device 10 may include first to third structures W1, W2, and W3 which are sequentially stacked in the recited order. The structure may correspond to a wafer, a die, or a part of a wafer. The first to third structures W1, W2, and W3 may be hybrid-bonded to each other. Hybrid-bonding involves bonding the structures together at the atomic level creating a strong and reliable connection. It can be achieved by bonding insulation layers or bonding pads which are positioned to make direct contact with each other. Van der Waals forces cause the structures to stick to each other. In some embodiments the bonding may be enhanced by applying heat and or pressure.

In some embodiments, the first memory cell array 100 may be integrated in the first structure W1. The leakage control block 300 may be integrated in the second structure W2. The peripheral circuit block 200 may be integrated in the third structure W3.

The first structure W1 may include a body substrate. The memory cell array 100 may be formed on one surface of the body substrate. The body substrate may be removed after a process for forming stacked banks is completed.

The memory cell array 100 may include at least one layer of a memory bank MB. The memory bank MB may include at least two stacked memory cells MC. The at least two stacked memory cells MC may be stacked along the third direction D3 that may be perpendicular to the plane surface the body substrate defined by direction D1 and D2.

Each of the at least two stacked memory cells MC may include a word line WL, a bit line, an access transistor TR, a capacitor CAP and a plate line PL. The access transistor TR and the capacitor CAP may be arranged in the second direction D2 (e.g., a first horizontal direction). The word line WL may be extended in the first direction D1 (e.g., a second horizontal direction). The bit line may be extended in the third direction D3. The bit line in FIG. 7 may correspond to the bit line contact BLC in FIGS. 4 to 6.

The memory cell array 100 may include a DRAM memory cell array. Alternatively, the memory cell array 100 may have a cross point structure such as a PCRAM, an RERAM, an MRAM, and the like. The capacitor CAP may be replaced by another memory element.

For example, the stacked memory cells MC may share one bit line contact BLC. The bit line contact BLC may include a conductive material, for example, a silicon-base material, a metal-base material, a combination thereof, and the like.

The access transistor TR may be positioned between the bit line contact BLC and the capacitor CAP. The transistor TR may include an active layer ACT, a gate insulation layer GD and a word line WL.

The active layer ACT may be extended from a sidewall of the bit line contact BLC along the second direction D2. The active layer ACT may include a semiconductor material having conductive impurities. A plurality of the active layers ACT may be stacked along the third direction D3.

The word line WL may be formed on at least one side surface of the active layer ACT. The word line WL may be extended in the first direction D1. For example, the word line WL may be arranged over or under the active layer ACT corresponding to a central portion between the bit line contact BLC and the capacitor CAP. The gate insulation layer GD may be interposed between the word line WL and the active layer ACT. For example, when the upper and lower word lines WLU and WLL may be arranged on an upper surface and a lower surface of one active layer ACT, the upper word line WLU and the lower word line WLL may have different electric potentials. Alternatively, the word line WL may have a gate all around (GAA) structure configured to surround the active layer ACT. The word line WL may include a metal, a metal mixture, a metal alloy, a semiconductor material, and the like.

A first junction region SD1 may be formed in the active layer ACT between the word line WL and the bit line contact BLC. A second junction region SD2 may be formed in the active layer ACT between the word line WL and the capacitor CAP. The first and second junction regions SD1 and SD2 may include n type impurities having a high concentration. The first junction region SD1 may make contact with the bit line contact BLC. The second junction region SD2 may make contact with the capacitor CAP. The active layer ACT between the first junction region SD1 and the second junction region SD2 may be defined by a channel CH. The channel CH may be formed by a voltage applied to the word line WL and a voltage applied to the bit line contact BLC.

The active layers ACT stacked in the third direction D3 may be isolated and supported by an insulating interlayer ILD. For example, the insulating interlayer ILD may include an insulation material such as silicon oxide.

The capacitor CAP may be connected to the second junction regions SD2 of the access transistor TR. The capacitor CAP may include a storage node SN, a dielectric layer DE and a plate node PN. The storage node SN, the dielectric layer DE and the plate node PN may be horizontally arranged in the second direction D2. The storage node SN may have a horizontally arranged cylindrical shape. The plate node PN may have a shape expanded into an inner wall and an outer wall of the cylindrical storage node SN. The dielectric layer DE may be interposed between the storage node SN and the plate node PN. A plate line PL may be extended in a third direction D3. The plate line PL may make contact with the stacked plate nodes PN of the capacitor CAP.

In order to form the stack memory banks MB, the body substrate may be removed. When the body substrate may be removed, an upper surface and a lower surface of the memory cell array 100 may be exposed. Pad electrodes, which may transmit a signal to the memory cell array 100, may be formed on the exposed upper and lower surfaces of the memory cell array 100. The pad electrodes may be conductive pads configured to transmit signals to electrodes in the memory cell array 100.

A first bonding insulation layer 140 and first bonding pads 150 may be formed on the upper surface of the memory cell array 100 with the pad electrodes. The first bonding pads 150 may be electrically connected with the pad electrodes. FIG. 7 may show only the first bonding pads 150 electrically connected to the bit line contact BLC. Alternatively, bonding pads, which may be connected to the pad electrodes connected with the electrodes of the memory cell array 100 except for the bit line contact BLC, may be provided to the first bonding insulation layer 140.

The leakage control block 300 with the at least one selection switch SW may be integrated in the second structure SW2. The leakage control block 300 may include a single crystalline semiconductor layer 310. The selection switch SW may be positioned between the single crystalline semiconductor layers 310. The selection switch SW may have a vertical channel structure. The selection switch SW may connect or disconnect the at least one memory cell string CTR in the first structure W1 with or from the peripheral circuit block W3 in the third structure W3.

A structure of the leakage control block 300 and a method of manufacturing the leakage control block 300 with the selection switch SW will be illustrated later.

A second bonding insulation layer 340 and second bonding pads 350 may be formed on a bottom surface of the second structure W2 with the selection switch SW facing the first structure W1. The second bonding insulation layer 340 may be hybrid-bonded to the first bonding insulation layer 140 of the first structure W1. The second bonding pad 350 may be hybrid-bonded to the first bonding pad 150 of the first structure W1. A third bonding insulation layer 380 and a third bonding pad 390 may be further formed on an upper surface of the second structure W2 facing the third structure W3. The leakage control block 300 may include a wiring structure MS configured to electrically connect the selection switch SW with the third bonding pad 390. Thus, the selection switch SW and the third bonding pad 390 may be electrically connected with each other by the wiring structure MS. Although not depicted in drawings, a wiring structure may also be interposed between the selection switch SW and the second bonding pad 150.

The third structure W3 may include a semiconductor substrate 201. A plurality of transistors tr may be formed on the substrate 201. Thus, the third structure W3 may include the peripheral circuit block 200 including the column decoding block 210a and the row decoding block 220. A fourth bonding insulation layer 280 and fourth bonding pads 290 may be formed on a bottom surface of the third structure W3 facing the second structure W2. The peripheral circuit block 200 may further include a wiring structure ms. The wiring structure ms may include a plurality of multi-layered metal wirings configured to electrically connect the fourth bonding pads 290 with the transistors tr. The wiring structure ms may be a conductive path configured to reciprocally transmit a current in the vertical direction, i.e., the third direction D3.

The fourth bonding insulation layer 280 of the third structure W3 may be directly bonded to the third bonding insulation layer 380 of the second structure W2. The fourth bonding pad 290 of the third structure W3 may be directly bonded to the third bonding pad 390 of the second structure W2.

Therefore, the first structure W1 with the memory cell array 100, the second structure W2 with the leakage control block 300 and the third structure W3 with the peripheral circuit block 200 may be hybrid-bonded to each other to form the stack-type memory device 10.

According to some embodiments, the leakage control block 300 may be interposed between the memory cell array 100 and the peripheral circuit block 200 to selectively connect or disconnect the memory cell array 100 with or from the peripheral circuit block 200, thereby preventing the leakage charges from infiltrating into the peripheral circuit block 200.

Further, the leakage control block 300 may be positioned adjacent to the memory cell block 100 and the peripheral circuit block 200 to reduce a transmission path of the leakage charges.

Furthermore, the leakage control block 300 may be formed in the structure independently upon the memory cell array 100 and the peripheral circuit block 200. Thus, the channel of the selection switch SW as the actual current path may include a material that may slightly receive the leakage influence.

FIGS. 8A to 11A and 14A are simplified cross-sectional view schematics illustrating a method of manufacturing a selection switch of a leakage control block in accordance with an embodiment of the present disclosure. FIGS. 8B to 11B, 12, 13 and 14B are simplified cross-sectional view schematics illustrating a method of manufacturing a selection switch of a leakage control block in accordance with an embodiment of the present disclosure. FIGS. 8B to 11B, 12, 13 and 14B are simplified cross-sectional view schematics taken along a line a-a' in FIGS. 8A to 11A and 14A.

Figure 8A:
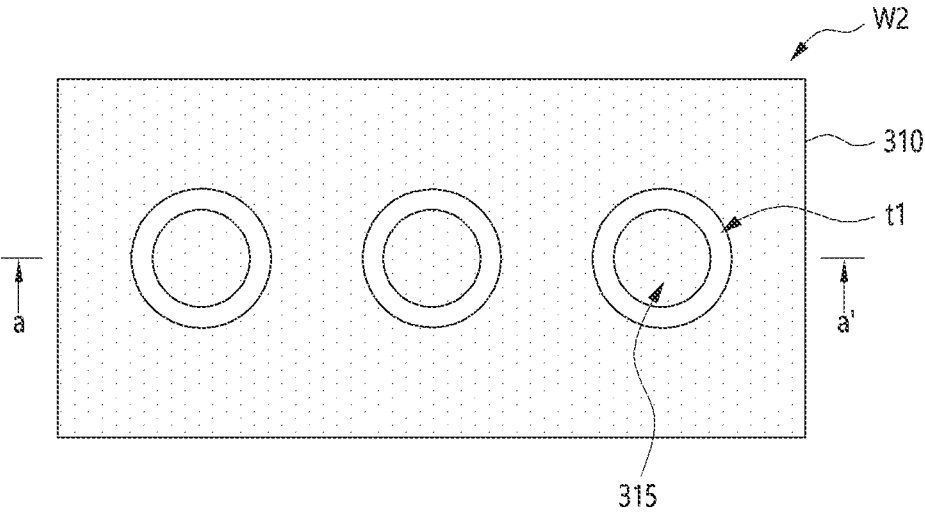
FIGS. 8A to 11B, 12, 13 and 14B are simplified cross-sectional view schematics illustrating a method of manufacturing a selection switch of a leakage control block in accordance with an embodiment of the present disclosure.
Figure 8B:
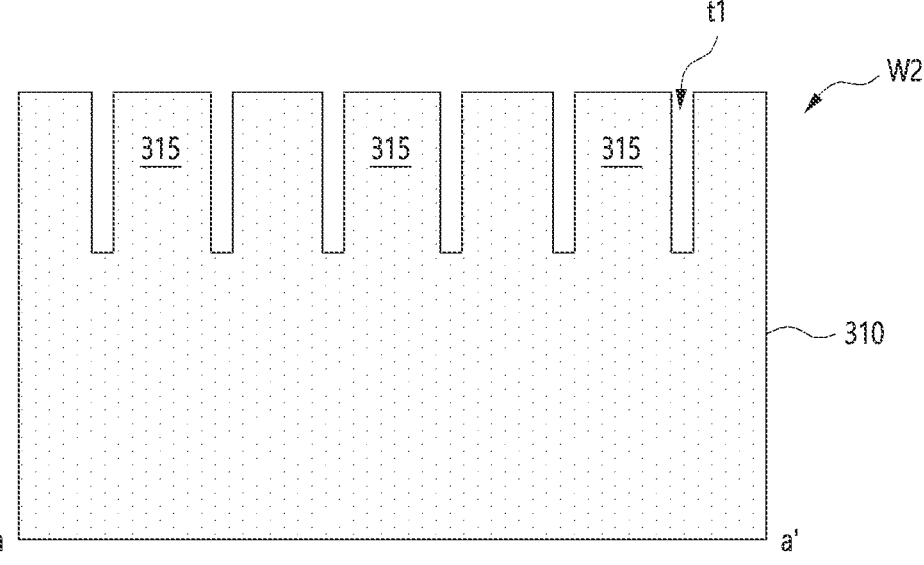

Referring to FIGS. 8A and 8B, the second structure W2 may include the semiconductor layer 310. The semiconductor layer 310 may have the single crystalline structure. For example, the semiconductor layer 310 may include a silicon layer, a silicon substrate, an epitaxial growth layer, a silicon germanium layer, and the like. The semiconductor layer 310 may include first conductive type impurities, for example, p type impurities.

A trench t1 for defining a pillar 315 may be formed in the semiconductor layer 310. The trench t1 may have a width and a depth. The trench t1 may have a planar ring shape. A part of the semiconductor layer 310 may be defined as the pillar 315 of the selection switch SW by the ring-shaped trench t1. The width of the trench t1 may be set based on a width of a gate. The depth of the trench t1 may be set based on a height of the selection switch SW.

Figure 9A:
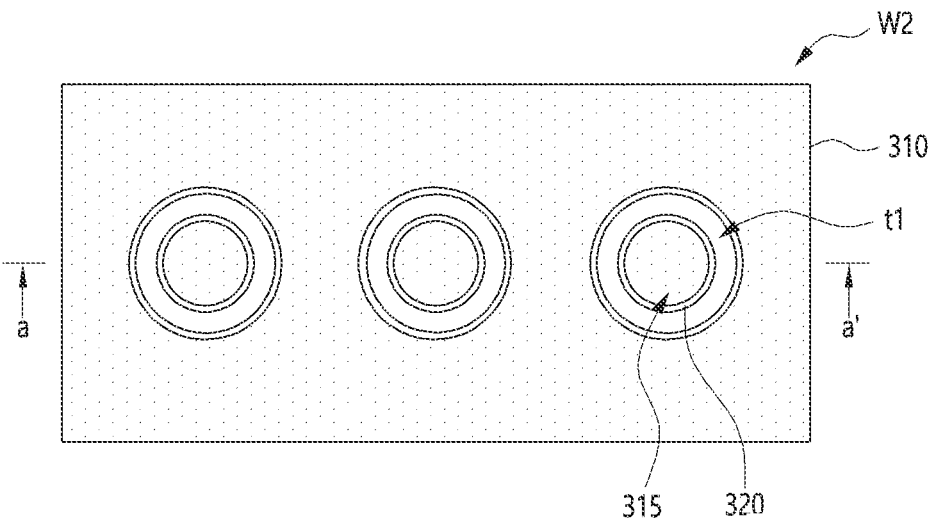
Figure 9B:
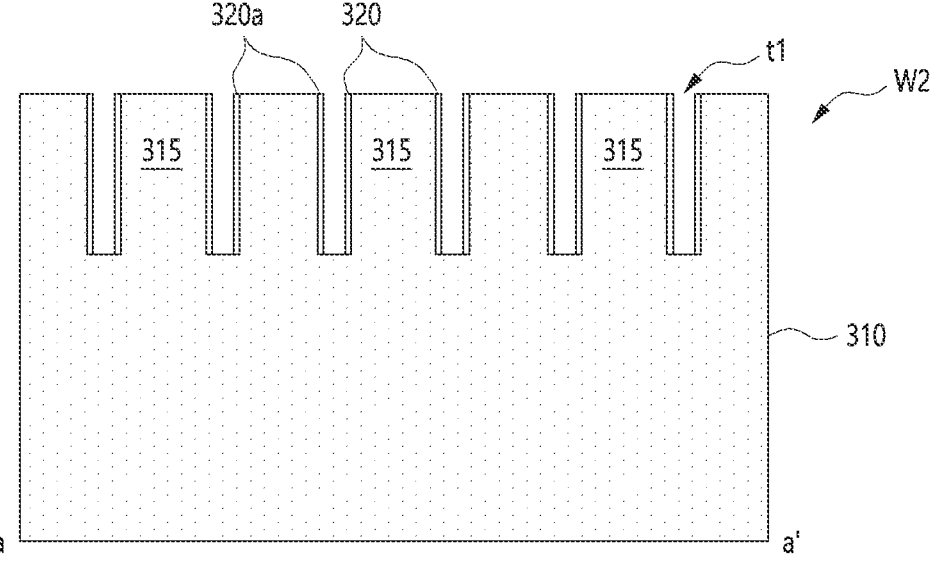

Referring to FIGS. 9A and 9B, gate insulation layers 320 and 320a may be formed on both sidewalls of the trench t1.

For example, an insulation layer having a conformal thickness may be formed on an upper surface of the semiconductor layer 310 with the trench t1. The insulation layer on the upper surface of the semiconductor layer 310 and a bottom surface of the trench t1 may be removed by an anisotropic etching process to form the gate insulation layers 320 and 320a on both sidewalls of the trench t1. The gate insulation layers 310 and 320a may include silicon oxide layers. Thus, outer circumferential surfaces of the pillar 315 and the semiconductor layer 310 may be covered by the gate insulation layers 320 and 320a.

Figure 10A:
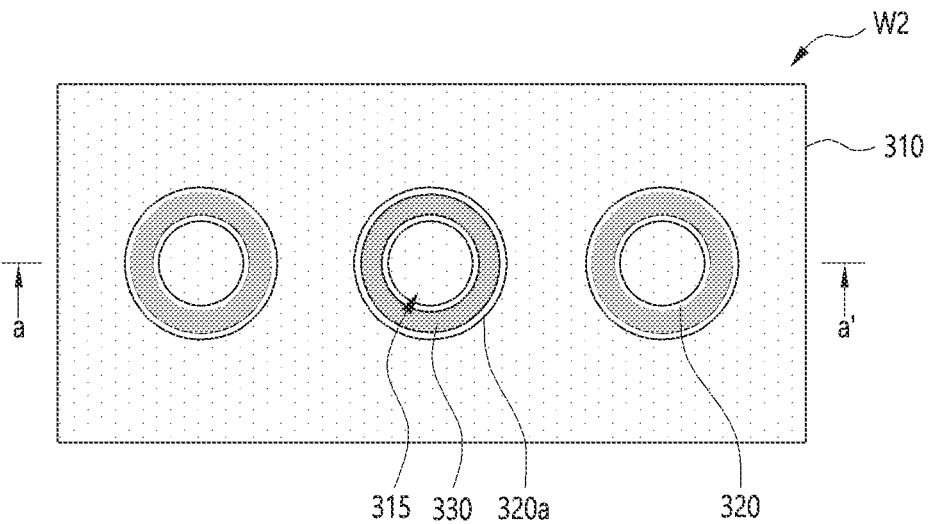
Figure 10B:
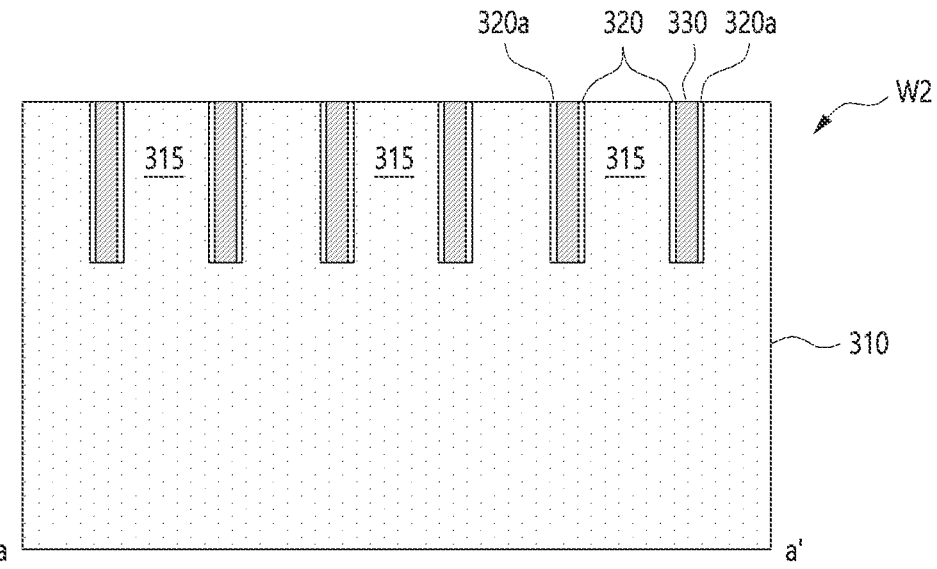

Referring to FIGS. 10A and 10B, a gate 330 may be formed in the trench t1.

For example, the gate 330 may be formed by forming a conductive layer in the trench t1, and planarizing the conductive layer until the upper surface of the semiconductor layer 310 may be exposed. The conductive layer may include a polysilicon layer with conductive impurities, at least one metal, and the like. In example embodiments, the gate 330 may have a ring shape configured to surround the pillar 315.

Figure 11A:
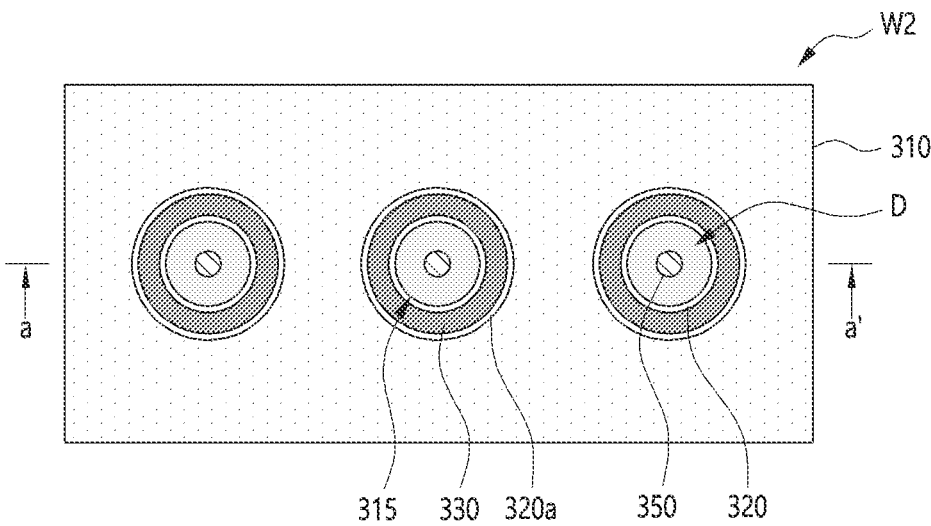
Figure 11B:
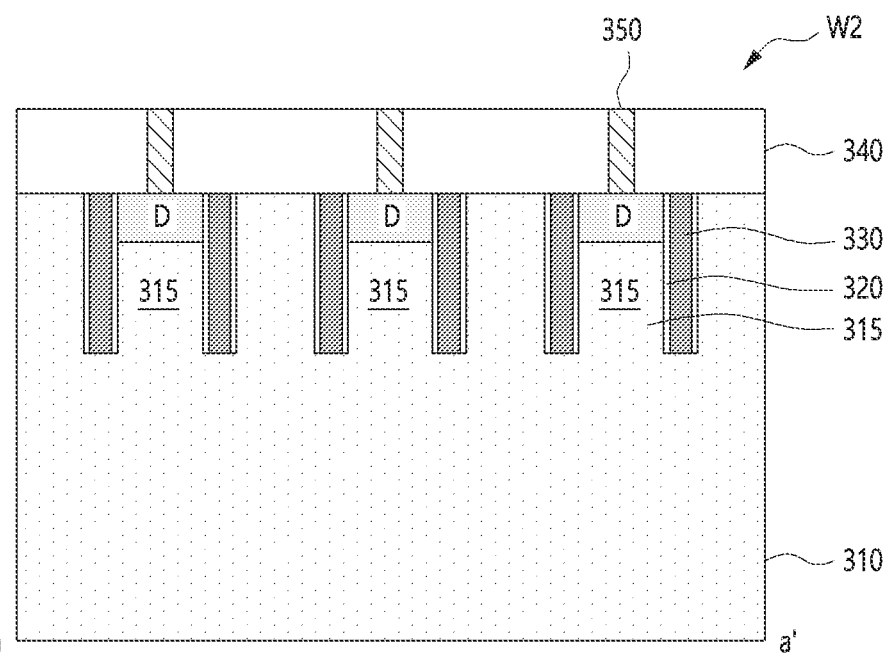

Referring to FIGS. 11A and 11B, second conductive type impurities may be implanted into an upper surface of the pillar 315 surrounded by the gate 330 to form a drain D. The second conductive type impurities may include n type impurities having a high concentration.

The second bonding insulation layer 340 may be formed on the upper surface of the semiconductor layer 310 with the drain D. The second bonding insulation layer 340 may include a silicon oxide layer. The second bonding insulation layer 340 may be etched until the drain D may be opened to form a contact hole which is filled with a conductive layer, for example, a copper layer to form the second bonding pad 350.

In FIGS. 11A and 11B, the second bonding pad 350 may directly make contact with the drain D. At least one conductive layer or a wiring structure may be interposed between the second bonding pad 350 and the drain D. In order to show a connection relation between the drain D of the selection switch SW and the second bonding pad 350, the second bonding insulation layer 340 may be omitted in FIG. 11A.

Figure 12:
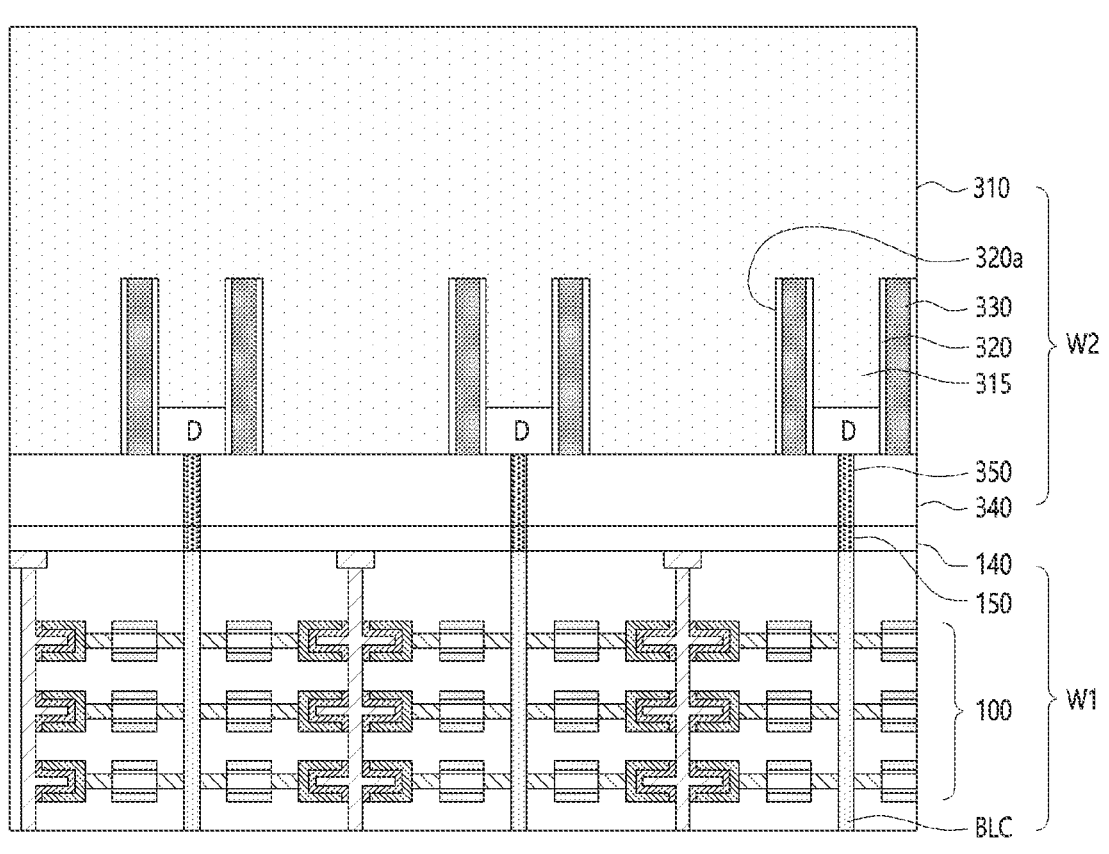

Referring to FIG. 12, the second structure W2 may be stacked on the first structure W1 with the memory cell array 100. For example, the second bonding insulation layer 340 of the second structure W2 may be directly bonded to the first bonding insulation layer 140 of the first structure W1. The first bonding pad 140 and the second bonding pad 350 may be directly bonded to each other to hybrid-bond the second structure W2 to the first structure W1.

Figure 13:
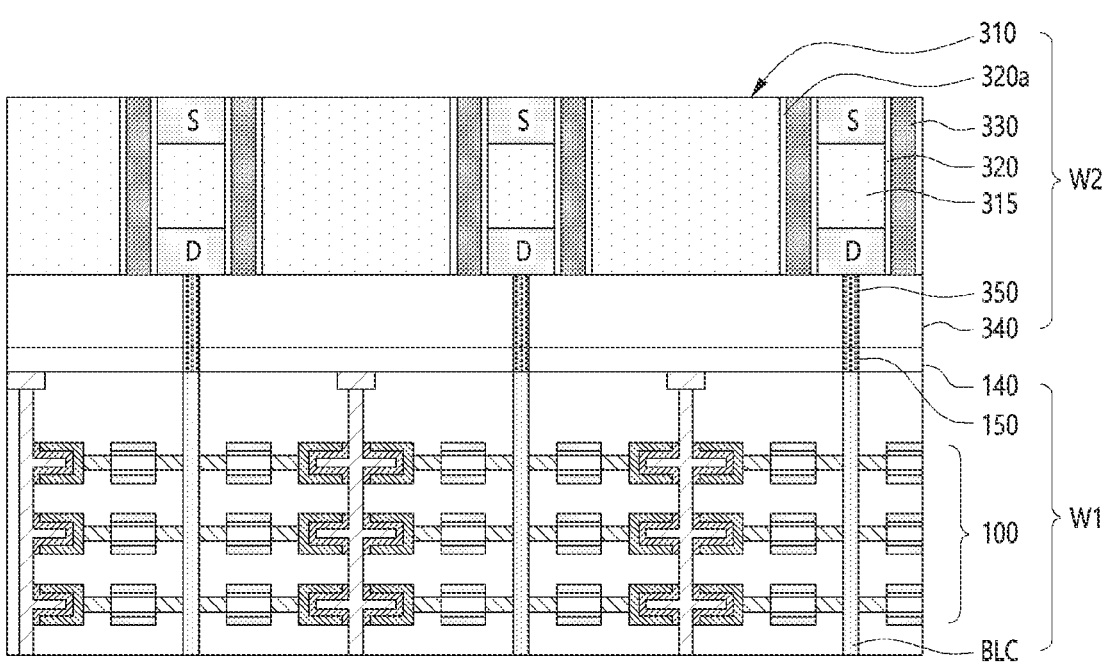

Because the flipped second structure W2 may be bonded to the first structure W1, a backside of the semiconductor layer 310 of the second structure W2 may be exposed. Referring to FIG. 13, the backside of the semiconductor layer 310 may be polished until a surface of the gate 330 may be exposed to reduce a thickness of the second structure W2, thereby exposing the pillar 315 of the selection switch SW.

Second conductive type impurities having a high concentration may be implanted into the exposed pillar 315 to form a source S. In some embodiments, after forming the drain D, the source S may be formed. Alternatively, the source S may be formed by implanting the impurities before forming the drain D in FIG. 11B. The drain D may be arranged under the pillar 315 and the source S may be arranged over the pillar 315 (see FIG. 13). Thus, the vertical channel extended in the third direction D3 may be formed in the pillar 315 between the drain D and the source S. Further, because the pillar 315 may include the single crystalline semiconductor layer 310, the vertical channel may also have the single crystalline structure so that a leakage current source in the selection switch SW may be decreased.

Figure 14A:
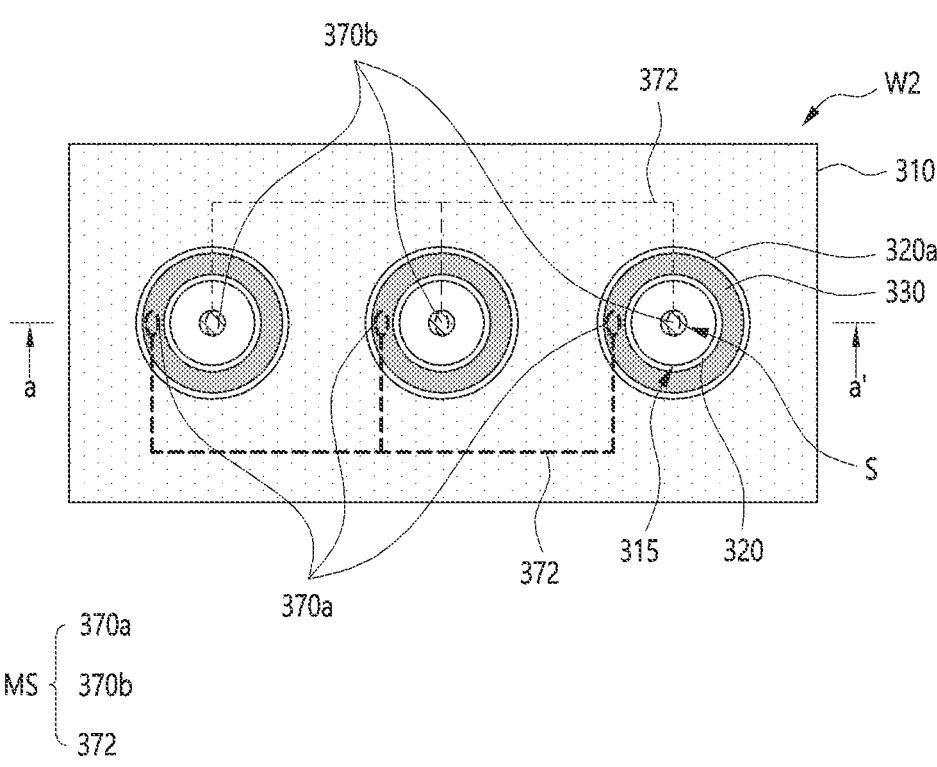
Figure 14B:
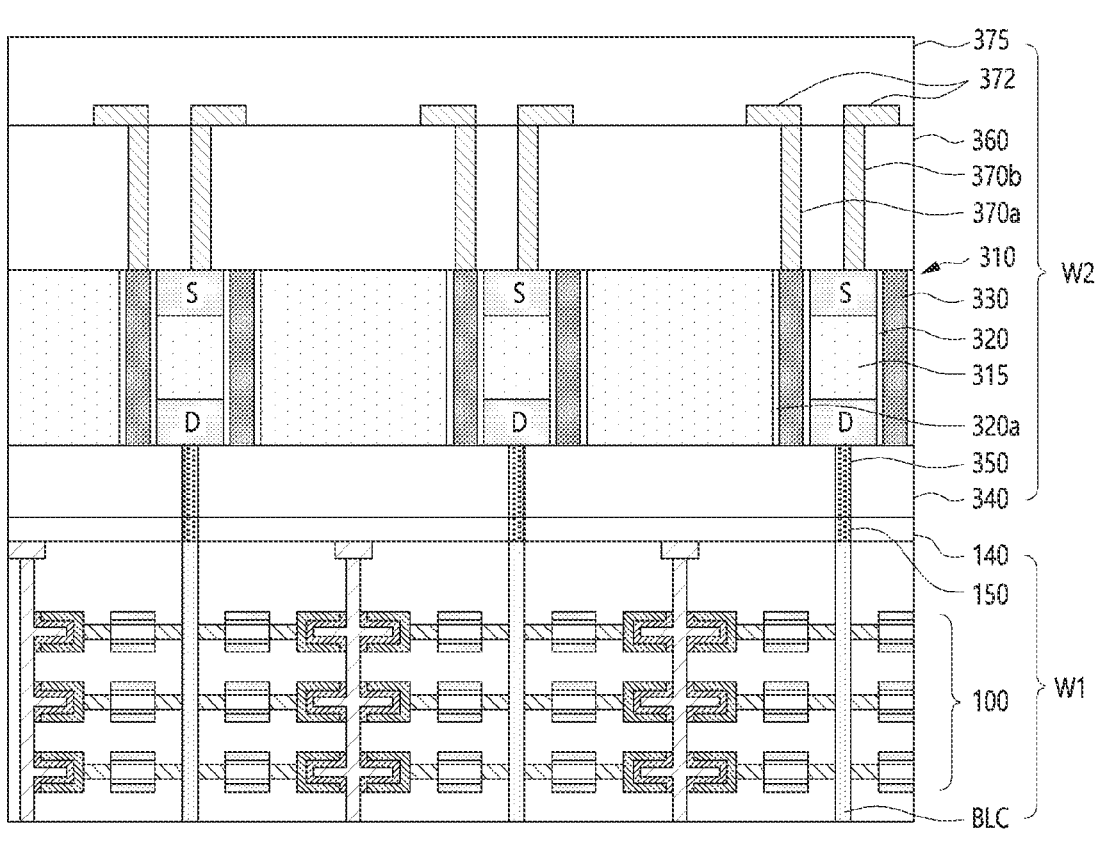

Referring to FIGS. 14A and 14B, the wiring structure MS may be formed at the gate 330 and the source S of the selection switch SW. The wiring structure MS may include a gate contact 370a, a source contact 370b and a plurality of conductive wirings 372. The gate contact 370a may be connected to the gate 330. The source contact 370b may be connected to the source S. The conductive wirings 372 may be connected to the gate contact 370a and the source contact 370b.

In some embodiments, when the gate insulation layers 320 and 320a are positioned on both sidewalls of the trench t1, the gate 330 may be isolated. That is, because the gate insulation layers 320 and 320a are positioned between the gate 330 and the semiconductor layer 310a as well as between the gate 330 and the pillar 315, the gate 330 of the selection switch SW is electrically isolated by the gate insulation layer 320a. Thus, the gate contact 370a and the source contact 370b may be provided to each of the selection switches SW.

A first insulating interlayer 360 may be formed on an exposed surface of the second structure W2 with the selection switches SW. The first insulating interlayer 360 may be etched until the source S and the gate 320 of each of the selection switches SW may be exposed to form via holes. The via holes may be filled with conductive material to form the gate contact 370a and the source contact 370b. The conductive wirings 372 may make contact with the gate contact 370a and the source contact 370b to form the wiring structure MS of the second structure W2. A protection layer 375 may then be formed on the wiring structure MS.

In FIG. 14B, the conductive wirings 372 connected to the gate contact 370a and the source contact 370b may be positioned on the first insulating interlayer 360, but are not limited thereto. For example, the conductive wirings 372 connected to the gate contact 370a and the source contact 370b may be positioned on different planes.

Alternatively, the gate insulation layer 320 may be positioned only between the gate 330 and the pillar 315. In this case, the gate 330 may contact the semiconductor layer 310.

Figure 15A:
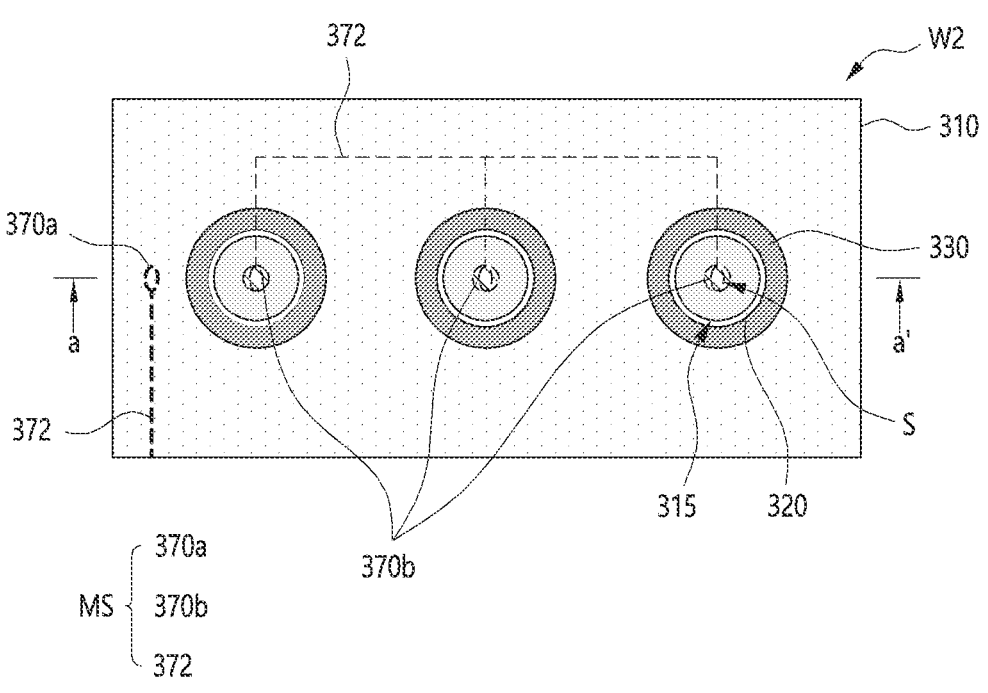
FIG. 15A is a plan view illustrating a leakage control block in accordance with an embodiment of the present disclosure.
Figure 15B:
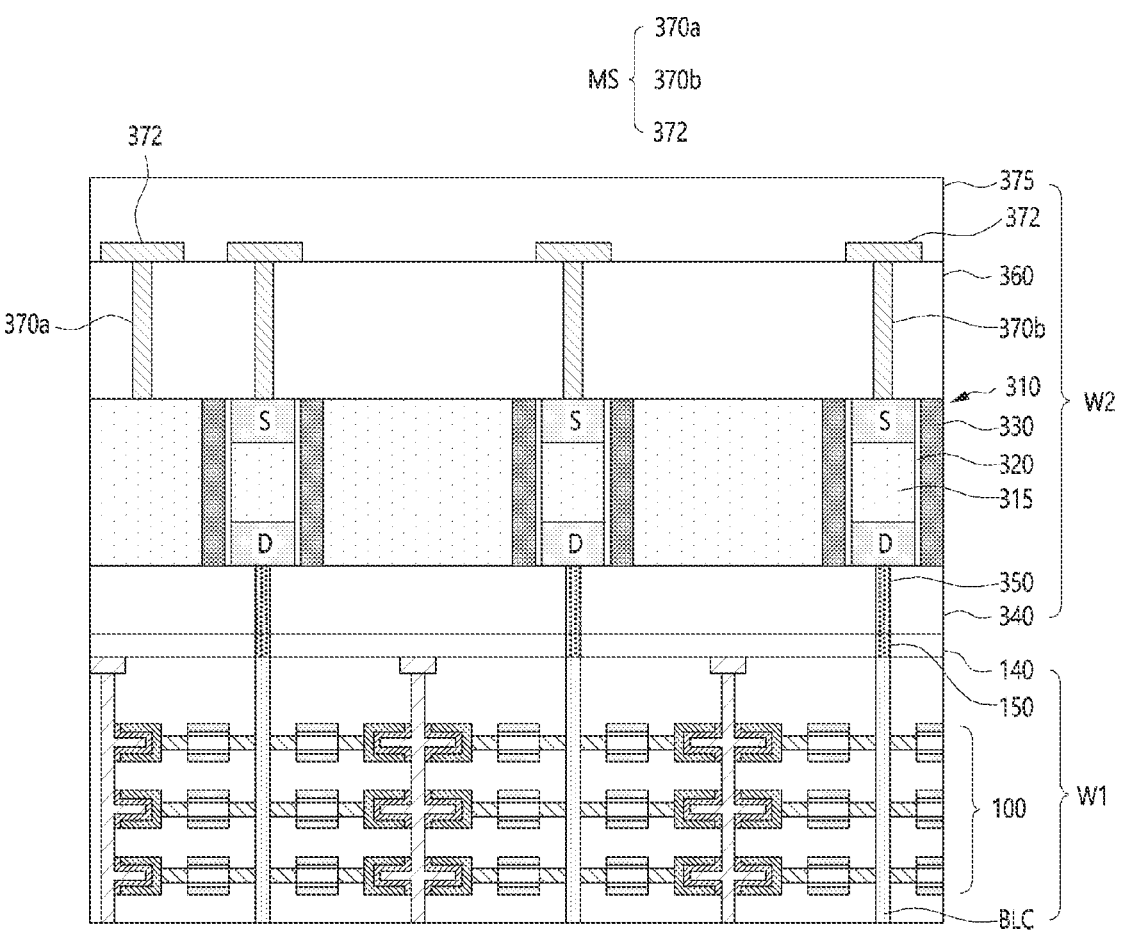
FIG. 15B is a simplified cross-sectional view schematic taken along a line a-a' in FIG. 15A.

FIG. 15A is a plan view illustrating a leakage control block in accordance with an embodiment of the present disclosure and FIG. 15B is a simplified cross-sectional view schematic taken along a line a-a' in FIG. 15A.

Referring to FIGS. 15A and 15B, when the gate insulation layer 320 is positioned only between the gate 330 and the pillar 315, as mentioned above, the gate 330 may directly contact the semiconductor layer 310. Thus, the semiconductor layer 310 outside the gate 330 may be used as a gate connection line connected between all gates 330 of the adjacent selection switches SW. In some embodiments, the semiconductor layer 310 may correspond to the gate signal line Lg in FIG. 6.

In this case, the gate contact 370a may be formed at a part of the semiconductor layer 310. The source contact 370b may contact the source S. The source contacts 370b may be connected with each other by one conductive line.

In some embodiments, the leakage control block 300 with the selection switch SW may be provided to the structure different from the structures with the memory cell array 100 and the peripheral circuit block 200. The leakage control block 300 may be formed at the structure including the single crystalline material, which may have a small leakage source. Thus, the channel of the selection switches SW may have a grain boundary smaller than that of other switch structures using a polysilicon channel to reduce the leakage current.

The third structure W3 with the peripheral circuit block 200 may be hybrid-bonded to the second structure W2 to complete the stack-type memory device 10.

According to some embodiments, the leakage control block with the selection switch may be interposed between the memory cell array and the peripheral circuit block. The selection switch of the leakage control block may selectively connect or disconnect the at least one memory cell string of the memory cell array with or from the peripheral circuit block. Thus, when all memory cells in the memory cell string are not selected, the leakage charges of the non-selected memory cells may not infiltrate into the peripheral circuit block to improve a recurrent ratio of the charges.

Particularly, the selection switch of the leakage control block may have the vertical channel structure. The selection switch may be adjacent to the memory cell array rather than the peripheral circuit block. Thus, the leakage current path may be greatly reduced to prevent deteriorations of electrical characteristics caused by the leakage current.

Further, because the charge loss may also be decreased by reducing the leakage current, a volume of the capacitor, which may be designed for having a large volume considering the charge loss, may be reduced. Thus, an integration degree of the capacitor may be improved by the reduced volume of the capacitor.

Furthermore, the leakage control block may be integrated in the structure which is different from the structures in which the memory cell array and the peripheral circuit block may be integrated. When the structure with the leakage control block includes the single crystalline semiconductor layer or a single crystalline semiconductor substrate, the current path of the selection switch, i.e., the channel of the selection switch may also include the single crystalline semiconductor material to reduce an incidental leakage current.

The above described embodiments of the present disclosure are intended to illustrate and not to limit the present invention. Various alternatives and equivalents are possible. The invention is not limited by the embodiments described herein. Nor is the invention limited to any specific type of semiconductor device. Other additions, subtractions, or modifications which are apparent in view of the present disclosure are intended to fall within the scope of the appended claims. Furthermore, the embodiments may be combined to form additional embodiments.

What is claimed is:

1. A stack-type memory device comprising:
a memory cell array including at least one memory cell string, the memory cell string including a plurality of memory cells stacked in a vertical direction;
a peripheral circuit block including circuits configured to control operations of the memory cells; and
a leakage control block arranged between the memory cell array and the peripheral circuit block, the leakage control block including at least one selection switch configured to selectively connect and disconnect the at least one memory cell string to the peripheral circuit block,
wherein the memory cell array, the leakage control block and the peripheral circuit block are stacked in the vertical direction.

2. The stack-type memory device of claim 1,
wherein the selection switch comprises a vertical channel configured to selectively connect and disconnect the at least one memory cell string to the peripheral circuit block, and wherein the vertical channel has a single crystalline structure.

3. The stack-type memory device of claim 1, wherein the selection switch comprises:
a single crystalline pillar extended in a direction substantially parallel to the vertical direction;
a gate formed on an outer surface of the pillar;
a gate insulation layer arranged between the pillar and the gate;
a drain formed in the pillar adjacent to the memory cell array; and
a source formed in the pillar adjacent to the peripheral circuit block.

4. The stack-type memory device of claim 1, wherein the memory cell array is integrated in a first structure, the leakage control block is integrated in a second structure different from the first structure, the peripheral circuit block is integrated in a third structure different from the first and second structures, and the first to third structures are hybrid-bonded to each other.

5. The stack-type memory device of claim 4, wherein the second structure comprises a single crystalline semiconductor layer, and
wherein the selection switch comprises:
a pillar including a part of the single crystalline semiconductor layer;
a gate formed on an outer surface of the pillar;
a gate insulation layer arranged between the pillar and the gate;
a drain formed in the pillar adjacent to the memory cell array; and
a source formed in the pillar adjacent to the peripheral circuit block.

6. The stack-type memory device of claim 5, wherein the single crystalline semiconductor layer is positioned outside the gate.

7. The stack-type memory device of claim 6, wherein the gate insulation layer is arranged between the gate and the single crystalline semiconductor layer.

8. The stack-type memory device of claim 1, wherein the memory cell string comprises a bit line contact extending in the vertical direction and commonly connected with the stacked memory cells.

9. The stack-type memory device of claim 8, wherein each of the memory cells comprises:
at least one active layer extending from a sidewall of the bit line contact in a horizontal direction intersected with the vertical direction;
a word line arranged on at least one of an upper surface and a lower surface of the active layer and extending in a direction intersected with the active layer and the bit line contact; and
a capacitor electrically connected with an end of the active layer spaced apart from the bit line contact.

10. The stack-type memory device of claim 1, wherein the peripheral circuit block comprises a column decoding block configured to provide a memory cell selected from the memory cells with a driving voltage, and the selection switch is electrically connected with the column decoding block.

11. The stack-type memory device of claim 1, wherein the selection switch is turned-on when a memory cell of the memory cells in the memory cell string connected with the selection switch is selected, and the selection switch is turned-off when all memory cells in the memory cell string connected with the selection switch are not selected.

12. The stack-type memory device of claim 11, wherein the memory cell array comprises a plurality of the memory cell strings, and the selection switch of the leakage control block comprises a plurality of switches connected with the memory cell strings, respectively.

13. A stack-type memory device comprising:
a first structure including a memory cell array, the memory cell array including a plurality of memory cell strings, each of the memory cell strings including a plurality of memory cells
a second structure hybrid-bonded to the first structure, the second structure including a leakage control block, the leakage control block including a plurality of selection switches connected to at least one of the memory cell strings; and
a third structure hybrid-bonded to the second structure, the third structure including a peripheral circuit block selectively connected to and disconnected from the memory cell string by driving the selection switches.

14. The stack-type memory device of claim 13, wherein at least one of the first to third structures comprises a wafer, a part of a wafer or a die.

15. The stack-type memory device of claim 13, wherein the second structure comprises a single crystalline semiconductor layer.

16. The stack-type memory device of claim 15, wherein each of the selection switches comprises:
a pillar extending from the single crystalline semiconductor layer in a vertical direction;

a gate formed on an outer surface of the pillar;
a gate insulation layer arranged between the pillar and the gate;
a drain formed in the pillar adjacent to the memory cell array; and
a source formed in the pillar adjacent to the peripheral circuit block.

17. The stack-type memory device of claim 16, wherein the single crystalline semiconductor layer directly contacts an outer sidewall of the gate to connect the gates of the adjacent selection switches to each other.

18. The stack-type memory device of claim 16, wherein the single crystalline semiconductor layer is positioned outside the gate.

19. The stack-type memory device of claim 16, wherein each of the memory cell strings comprises a bit line extending in the vertical direction, the memory cells in each of the memory cell strings commonly connected to the bit line and stacked in the vertical direction, and the bit line is hybrid-bonded to the drain of the selection switch.

20. The stack-type memory device of claim 16, wherein the peripheral circuit block comprises a column decoding block configured to provide a memory cell selected from the memory cells with a driving voltage, and the column decoding block is electrically connected to the source of the selection switch.

*   *   *   *   *